US010401414B2

(12) United States Patent
Matsushita et al.

(10) Patent No.: US 10,401,414 B2
(45) Date of Patent: Sep. 3, 2019

(54) METHOD OF TESTING WIND-TURBINE RECEPTOR

(71) Applicant: MITSUBISHI HEAVY INDUSTRIES, LTD., Tokyo (JP)

(72) Inventors: Takatoshi Matsushita, Tokyo (JP); Keisuke Ota, Tokyo (JP); Osamu Hasegawa, Tokyo (JP); Kengo Imaoka, Tokyo (JP); Koji Fukami, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 277 days.

(21) Appl. No.: 15/427,498

(22) Filed: Feb. 8, 2017

(65) Prior Publication Data

US 2017/0248647 A1 Aug. 31, 2017

(30) Foreign Application Priority Data

Feb. 26, 2016 (JP) ................................ 2016-035528

(51) Int. Cl.

| | |
|---|---|
| ***G01R 31/02*** | (2006.01) |
| ***F03D 17/00*** | (2016.01) |
| ***B64C 39/02*** | (2006.01) |
| ***F03D 1/06*** | (2006.01) |
| ***F03D 80/30*** | (2016.01) |

(52) U.S. Cl.

CPC .......... *G01R 31/026* (2013.01); *B64C 39/024* (2013.01); *F03D 1/0633* (2013.01); *F03D 1/0675* (2013.01); *F03D 17/00* (2016.05); *F03D 80/30* (2016.05); *B64C 2201/027* (2013.01); *B64C 2201/108* (2013.01); *B64C 2201/12* (2013.01); *F05B 2240/221* (2013.01); *F05B 2260/83* (2013.01); *G01R 31/02* (2013.01); *Y02E 10/721* (2013.01)

(58) Field of Classification Search

CPC ....... G01R 31/026; G01R 31/02; F03D 17/00; F03D 1/0675; F03D 1/0633; F03D 80/30; B64C 39/024; B64C 2201/12; B64C 2201/00; B64C 2201/108; Y02E 10/721; F05B 2240/221; F05B 2260/83

USPC .................................................. 324/538, 715

See application file for complete search history.

(56) References Cited

U.S. PATENT DOCUMENTS 8,517,681 B2 * 8/2013 Naka ...................... F03D 80/30 416/1
2010/0013226 A1 1/2010 Blumer et al.
(Continued)

FOREIGN PATENT DOCUMENTS

CN 104330682 A 2/2015
DE 102008053928 A1 5/2010
(Continued)

OTHER PUBLICATIONS

Japan Patent Office, "Office Action for Japanese Patent Application No. 2016-035528," dated Dec. 11, 2017.
(Continued)

*Primary Examiner* — Farhana A Hoque
(74) *Attorney, Agent, or Firm* — Manabu Kanesaka

(57) ABSTRACT

A method of testing a receptor of a wind turbine includes a step of moving an unmanned aerial vehicle (UAV) close to the receptor of a wind turbine blade mounted to a hub of the wind turbine, and performing an electric continuity test on the receptor.

13 Claims, 15 Drawing Sheets

(56) References Cited

U.S. PATENT DOCUMENTS

| | | | | |
|---|---|---|---|---|
| 2010/0021288 | A1 | 1/2010 | Collette | |
| 2011/0142643 | A1 | 6/2011 | Hardison et al. | |
| 2012/0093660 | A1 | 4/2012 | Smith | |
| 2012/0300059 | A1 | 11/2012 | Stege | |
| 2013/0235897 | A1 | 9/2013 | Bouteyre et al. | |
| 2013/0307274 | A1 * | 11/2013 | Sia | F03D 5/00 290/55 |
| 2015/0137523 | A1 | 5/2015 | Sia | |
| 2015/0267688 | A1 | 9/2015 | Krampe | |
| 2016/0017866 | A1 | 1/2016 | Craft et al. | |
| 2016/0047850 | A1 * | 2/2016 | Bruins | F03D 80/00 324/715 |

FOREIGN PATENT DOCUMENTS

| | | | |
|---|---|---|---|
| DE | 102011118833 | B3 | 1/2013 |
| DE | 102013103343 | A1 | 10/2014 |
| EP | 2518312 | A1 | 10/2012 |
| JP | H04-117121 | A | 4/1992 |
| JP | H05-285743 | A | 11/1993 |
| JP | 2013-029351 | A | 2/2013 |
| JP | 2013-542360 | A | 11/2013 |
| JP | 5487308 | B2 | 5/2014 |
| JP | 2016-042087 | A | 3/2016 |
| WO | 2011/077970 | A1 | 6/2011 |
| WO | 2012/013878 | A1 | 2/2012 |

OTHER PUBLICATIONS

Europe Patent Office, "Office Action for European Patent Application No. 17152148.7," dated Feb. 23, 2018.

Europe Patent Office, "Search Report for European Patent Application No. 17152148.7," dated Jul. 6, 2017.

* cited by examiner

METHOD OF TESTING WIND-TURBINE RECEPTOR

RELATED APPLICATIONS

The present application is based on, and claims priority from, Japanese Application No. JP2016-035528 filed Feb. 26, 2016, the disclosure of which is hereby incorporated by reference herein in its entirety.

TECHNICAL FIELD

The present disclosure relates to a method of testing a receptor mounted to a wind turbine blade.

BACKGROUND ART

To protect a wind turbine blade from lightning strikes, normally, a receptor (metal lightning-receiving part) is mounted to a blade surface to receive lightning strikes. A receptor is, for instance, connected to an earth wire via a down-conductor so as to guide lightning current received by the receptor to the earth wire.

For instance, Patent Document 1 discloses a wind turbine power generating apparatus including a plurality of receptors disposed on the surface of a blade body so as to be exposed, and a down-conductor disposed inside the blade body and connected electrically to the receptors.

CITATION LIST

Patent Literature

Patent Document 1: EP2518312A

SUMMARY

Meanwhile, if electric connection between a receptor disposed on the surface of a wind turbine blade and an earth wire is not secure, there is a risk of occurrence of sparks upon receipt of lightning by the receptor, which may cause damage to the wind turbine blade. In view of this, one may consider performing an electrical continuity test on a receptor of a wind turbine blade, but it is not easy to perform an electric continuity test on a receptor while a wind turbine blade is mounted to a hub.

An object of at least some embodiments of the present invention is to provide a method of testing a wind-turbine receptor whereby it is possible to perform an electric continuity test simply on a receptor of a wind turbine blade.

(1) A method of testing a receptor of a wind turbine, according to at least some embodiments of the present invention, comprises: a step of moving an unmanned aerial vehicle (UAV) close to the receptor of a wind turbine blade mounted to a hub of the wind turbine, and performing an electric continuity test on the receptor.

According to the above method (1), using a UAV makes it easier to approach the receptor of the wind turbine blade mounted to the hub, and to perform an electrical continuity test on the receptor simply. Thus, it is possible to shorten the testing time, as well as to reduce the testing costs, as compared to an electric continuity test using a vehicle for work at height (2) In some embodiments, the above method (1) further comprises a step of forming an electric continuity test circuit including the receptor by using the UAV. The step of performing the electric continuity test includes applying a voltage to the electric continuity test circuit.

According to the above method (2), the electric continuity test circuit including the receptor can be readily formed by using the UAV, and thereby it is possible to improve the efficiency of continuity test works for the receptor.

(3) In some embodiments, in the above method (2), the receptor is disposed on a tip portion of the wind turbine blade, and the method further comprises a step of engaging the tip portion of the wind turbine blade with a position-determining portion disposed on the UAV to retain a relative position of the UAV with respect to the receptor.

According to the above method (3), the tip portion of the wind turbine blade is in engagement with the position-determining portion of the UAV to retain the relative position of the UAV with respect to the receptor. Accordingly, it is possible to perform works for forming the electric continuity test circuit including the receptor efficiently by using the UAV.

(4) In some embodiments, in the above method (3), the position-determining portion includes at least one of: a cap engageable with the tip portion of the wind turbine blade; a clamp configured to nip the tip portion of the wind turbine blade in response to operation of a link mechanism by being pressed against the tip portion of the wind turbine blade; or a shaping portion which is deformable so as to follow an outer shape of the tip portion by being pressed against the tip portion of the wind turbine blade.

According to the above method (4), making use of the position determining portion including at least one of: the cap to be in engagement with the tip portion of the wind turbine blade; the clamp configured to nip the tip portion of the wind turbine blade; or the shaping portion being deformable so as to follow the outer shape of the tip portion, makes it possible to retain the relative position of the UAV with respect to the receptor reliably. Accordingly, it is possible to perform works for forming the electric continuity test circuit including the receptor efficiently by using the UAV.

(5) In some embodiments, in any one of the above methods (2) to (4), at least a part of the receptor, or at least a part of a portion of the wind turbine blade around the receptor is formed by a magnetic element. The step of forming an electric continuity test circuit includes connecting a wire to the receptor while applying a magnetic force generated by a magnetic-force generating part disposed on the UAV to the magnetic element.

According to the above method (5), at least a part of the receptor or a portion of the wind turbine blade around the receptor is formed by a magnetic element, and a magnetic force generated by the magnetic-force generating part is applied to the magnetic element, which makes it possible to improve the efficiency of works for connecting wire to the receptor by using the UAV (works for forming an electric continuity test circuit).

(6) In some embodiments, in the above method (5), the magnetic-force generating part is configured to be rotatable relative to a body of the UAV, about two axes orthogonal to an upward-and-downward direction of the UAV.

According to the above method (6), the magnetic-force generating part is configured to be rotatable with respect to the body of the UAV, and thus it is possible to attract the magnetic-force generating part toward the magnetic element reliably regardless of the relative attitude of the UAV with respect to the magnetic element (receptor or a peripheral portion thereof), which makes it possible to further improve the efficiency of works for connecting wire to the receptor by the UAV.

(7) In some embodiments, in any one of the above methods (2) to (6), the UAV includes a shock absorbing member including a conductive portion at least on a surface side of the shock absorbing member. The step of forming the electric continuity test circuit includes forming the electric continuity test circuit by moving the UAV to press the shock absorbing member against the wind turbine blade and connect a wire to the receptor via the conductive portion of the shock absorbing member.

According to the above method (7), it is possible to connect wire to the receptor via the conductive portion of the shock absorbing member while mitigating shock due to contact between the UAV and the wind turbine blade with the shock absorbing member.

(8) In some embodiments, in any one of the above methods (2) to (7), the UAV includes a container storing a conductive element in a liquid form, a gel form or a powder form. The step of forming the electric continuity test circuit includes forming the electric continuity test circuit by moving the UAV to cause a portion of the wind turbine blade including the receptor to enter the container and connect a wire to the receptor via the conductive element.

According to the above method (8), it is possible to connect wire to the receptor via the conductive element efficiently, by operating the UAV so that a tip of the wind turbine blade enters the container storing the conductive element.

(9) In some embodiments, in any one of the above methods (2) to (8), the UAV includes a reel provided with a wire wound around the reel. The step of forming the electric continuity test circuit includes moving the UAV close to the wind turbine blade to connect the wire to the receptor, and unwinding the wire from the reel.

According to the above method (9), it is possible to move the UAV close to the wind turbine blade while the wire is wound around the reel, and thus it is possible to prevent a decrease in the attitude stability of the UAV due to a drag that the wire receives if the wire is suspended from the UAV while the UAV moves upward.

(10) In some embodiments, in the above method (9), the step of forming the electric continuity test circuit includes attaching the wire of the reel to the receptor by using the UAV, detaching the UAV from the reel, and allowing the reel to unreel and move downward.

According to the above method (10), if the reel is detached from the UAV to unreel and move down after an end of the wire is attached to the receptor, it is possible to form the electric continuity test circuit readily by a worker below the wind turbine blade recovering the other end of the wire and connecting the wire to an earth terminal.

(11) In some embodiments, in any one of the above methods (2) to (9), the step of forming the electric continuity test circuit includes connecting the receptor to an earth wire via a wire suspended from the UAV. The method further comprises a step of detaching the wire from the UAV, after performing the electric continuity test on the receptor.

According to the above method (11), it is possible to form the electric continuity test circuit readily by connecting the receptor to the earth wire via the wire suspended from the UAV. Furthermore, by detaching the wire from the UAV after completion of an electric continuity test, it is possible to improve the attitude stability of the UAV during downward movement of the UAV upon recovery of the UAV.

(12) In some embodiments, in the above method (2), the step of forming the electric continuity test circuit includes suspending a conductive cloth member which constitutes a part of the electric continuity test circuit from at least one of the UAV, moving the at least one UAV toward the wind turbine blade from an upwind side, and pressing the conductive cloth member against a portion of the wind turbine blade including the receptor by making use of wind.

According to the above method (12), it is possible to form the electric continuity test circuit readily by moving the UAV suspending the conductive cloth member to the wind turbine blade from the upwind side, and pressing the conductive cloth member against the receptor by making use of wind.

(13) In some embodiments, the above method (2) further comprises a step of injecting a conductive liquid to the receptor from the UAV. The step of forming the electric continuity test circuit includes connecting the receptor to the wire via a liquid flow of the conductive liquid.

According to the above method (13), it is possible to form the electric continuity test circuit readily by electrically connecting the receptor to the wire via a liquid flow of the conductive liquid.

(14) In some embodiments, in any one of the above methods (1) to (13), the method further comprises a step of surrounding the UAV with a wind shield member mounted to at least one auxiliary UAV.

According to the above method (14), the UAV is covered with the windshield member mounted to the at least one auxiliary UAV, and thus it is possible to maintain the attitude stability of the UAV without being affected by wind, while the UAV approaches the receptor, or while the UAV is in a standby state near the receptor.

(15) In some embodiments, in the above method (1), the step of performing the electric continuity test includes changing a magnetic field applied to the receptor by using the UAV and detecting an induction current generated in a circuit from the receptor to an earth wire.

According to the above method (15), changing a magnetic field applied to the receptor makes it possible to generate an induction current in a circuit (e.g. the down-conductor) from the receptor to the earth wire. Thus, it is possible to confirm electrical connection between the receptor and the earth wire with a simplified method of detecting an induction current generated in a circuit from the receptor to the earth wire.

According to some embodiments of the present invention, using the UAV to test the receptor of the wind turbine makes it easier to approach the receptor of the wind turbine blade mounted to the hub, and to perform an electric continuity test on the receptor simply. Thus, it is possible to shorten the testing time, as well as to reduce the testing costs, as compared to an electric continuity test using a vehicle for work at height.

DETAILED DESCRIPTION

Embodiments of the present invention will now be described in detail with reference to the accompanying drawings. It is intended, however, that unless particularly specified, dimensions, materials, shapes, relative positions and the like of components described in the embodiments shall be interpreted as illustrative only and not intended to limit the scope of the present invention.

Figure 1:
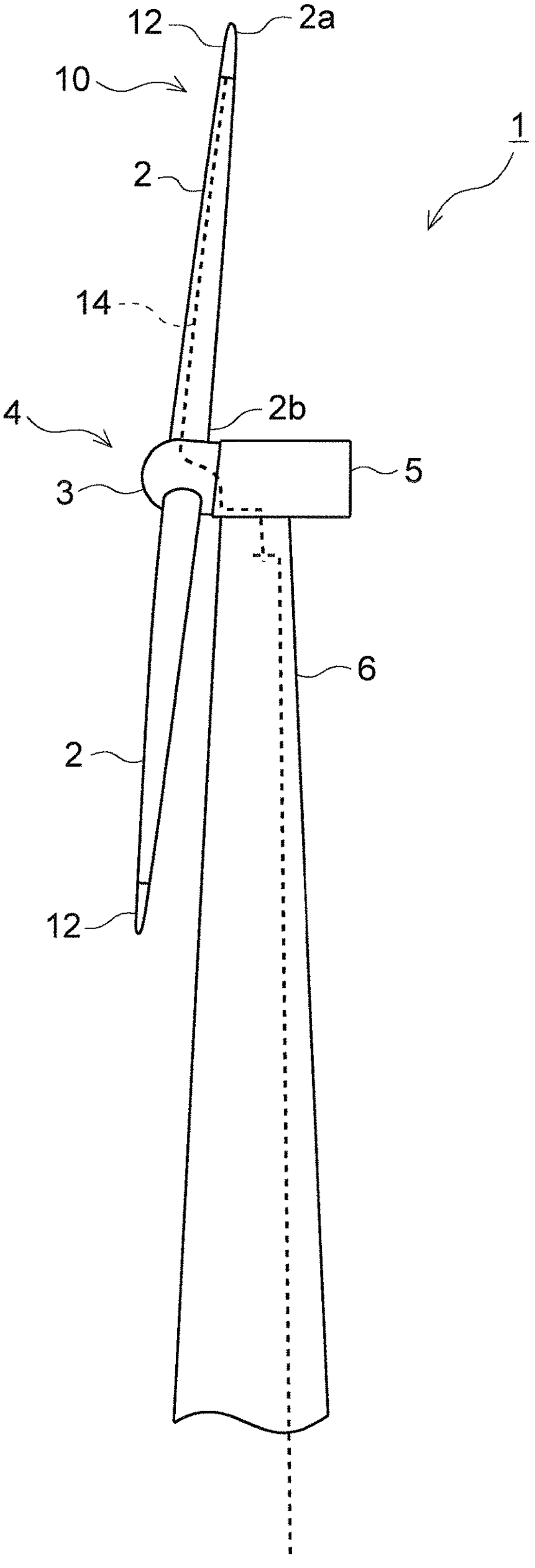
FIG. 1 is an overall configuration diagram of a wind turbine according to an embodiment.

Firstly, with reference to FIG. 1, an overall configuration of a wind turbine 1 according to some embodiments will be described. FIG. 1 is a schematic overall configuration diagram of the wind turbine 1 according to an embodiment.

In some embodiments, the wind turbine 1 includes at least one wind turbine blade 2, a hub 3 to which the wind turbine blade 2 is mounted, a nacelle 5 supporting a rotor 4 including the wind turbine blade 2 and the hub 3, and a tower 6 which supports the nacelle 5 revolvably. Rotation of the rotor 4 is inputted into a non-depicted generator, and the generator thereby generates electric power. The wind turbine 1 may be installed on land, or on water such as ocean and lake.

The wind turbine 1 having the above configuration is provided with a lightning protection device 10 including a receptor 12 for receiving lightning.

The lightning protection device 10 includes the receptor 12 mounted at least to the wind turbine blade 2, and a down-conductor 14 for guiding lightning current received by the receptor 12.

The receptor 12 is formed from a conductive material (e.g. metal material). For instance, the receptor 12 may be mounted to a tip portion 2*a* of the wind turbine blade 2. For instance, the receptor 12 may be a rod receptor or a disc receptor embedded onto the wind turbine blade 2, or a solid receptor forming the tip portion 2*a* of the wind turbine blade 2, for instance. Furthermore, the receptor 12 may be mounted between the tip portion 2*a* and a blade root 2*b* of the wind turbine blade 2.

The down-conductor 14 may be formed from a conductive material, and connected to an earth terminal disposed on a platform of the tower 6, extending from the receptor 12 through the wind turbine blade 2, the nacelle 5, and the tower 6.

In a case where the wind turbine 1 includes the lightning protection device 10 having the above configuration, electrical continuity may fail due to erosion or corrosion of the receptor 12, for instance. In this case, upon receipt of a lightning strike, sparks may be generated to cause serious damage.

In the present embodiment, a method for testing whether continuity of the receptor 12 is ensured will be described below.

FIGS. 2 to 15 are each a schematic diagram showing a method of testing the receptor 12 according to an embodiment.

As depicted in FIGS. 2 to 15, a method of testing the receptor 12 according to some embodiments includes a step of testing electrical continuity of the receptor 12 by moving an unmanned aerial vehicle (UAV) 20 toward the receptor 12 of the wind turbine blade 2 mounted to the hub 3 (see FIG. 1) of the wind turbine 1.

Using the UAV 20 to test the receptor 12 mounted to the wind turbine blade 2 makes it easier to approach the receptor 12 of the wind turbine blade 2 mounted to the hub 3, and to perform an electric continuity test on the receptor 12 readily. Thus, it is possible to shorten the testing time, as well as to reduce the testing costs, as compared to an electric continuity test using a vehicle for work at height.

Furthermore, in the present embodiment, the UAV 20 refers to an unmanned aerial vehicle in general. The UAV 20, for instance, may be an unmanned aerial vehicle utilizing a radio remote control. In this case, workers may perform a remote control around the wind turbine 1, or inside the wind turbine 1. Alternatively, the UAV 20 may be an unmanned aerial vehicle that does not require a remote control and is capable of autonomous flight.

Furthermore, the UAV 20 may be a rotorcraft provided with a plurality of rotors, being an unmanned aerial vehicle of a multi-copter type, configured to be controllable to move, stop, and the like, by controlling the rotation speeds of the respective rotors.

With reference to FIGS. 2 to 15, the above described method of testing the receptor 12 may further include a step of forming an electric continuity test circuit 30 including the receptor 12 by using the UAV 20.

In the step of performing an electric continuity test, a voltage is applied to the electric continuity test circuit 30.

Accordingly, the electric continuity test circuit 30 including the receptor 12 can be readily formed by using the UAV 20, and thereby it is possible to improve the efficiency of continuity test works for the receptor 12.

In an embodiment, as depicted in FIGS. 2 to 10, the electric continuity test circuit 30 includes a wire 31 mounted to the UAV 20 and being connectible to the receptor 12, a switch 32 connected to the wire 31, and an earth terminal 33 disposed on an end portion of the wire 31. Furthermore, the electric continuity test circuit 30 may further include an electrical contact portion (e.g. spring 34 in FIG. 2) for causing the wire 31 transported by the UAV 20 to make electrical contact with the receptor 12.

Figure 9A:
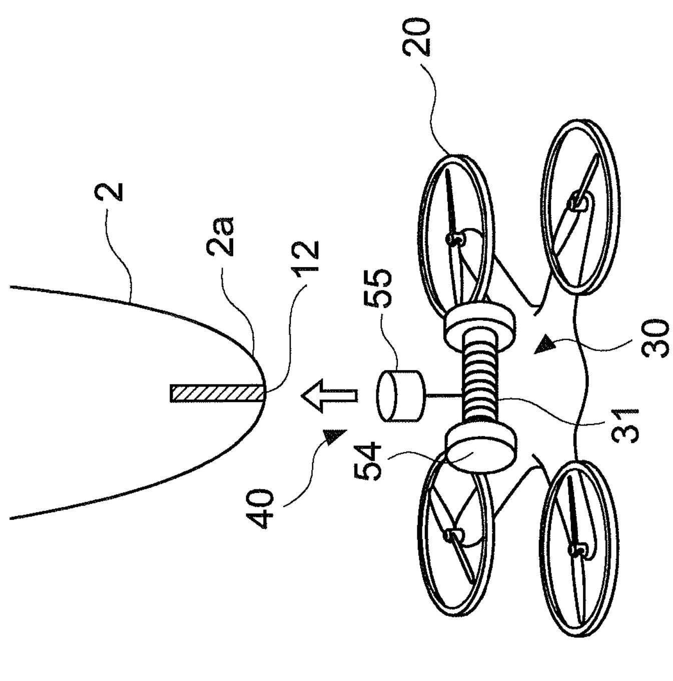
Figure 9B:
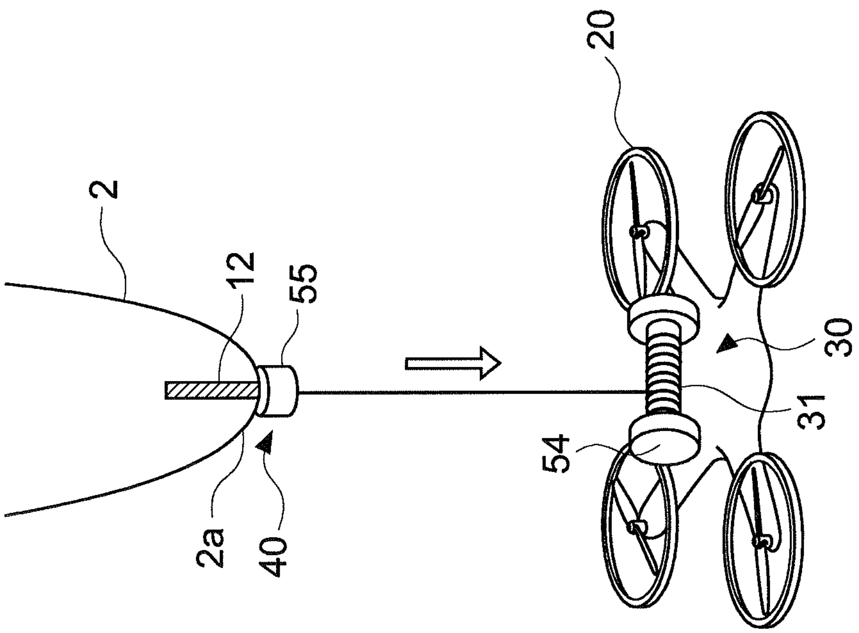
Figure 10:
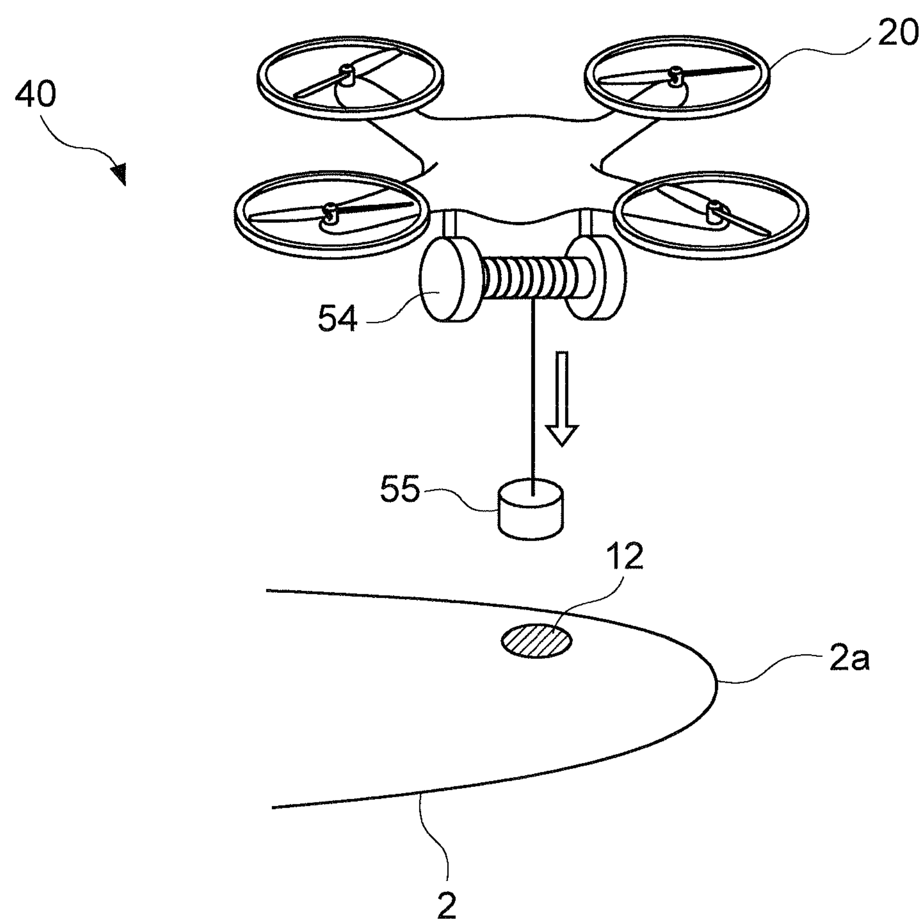

In FIGS. 9 and 10, the switch 32 and the earth terminal 33 are not depicted.

In an embodiment, as depicted in FIGS. 2 to 10, if the receptor 12 is disposed on the tip portion 2*a* of the wind turbine blade 2, the above described method of testing the receptor 12 may further include a step of engaging the tip portion 2*a* of the wind turbine blade 2 with a position determining portion 40 provided for the UAV 20 to retain a relative position of the UAV 20 with respect to the receptor 12.

Accordingly, it is possible to perform works for forming the electric continuity test circuit 30 including the receptor 12 efficiently by using the UAV 20.

Figure 7A:
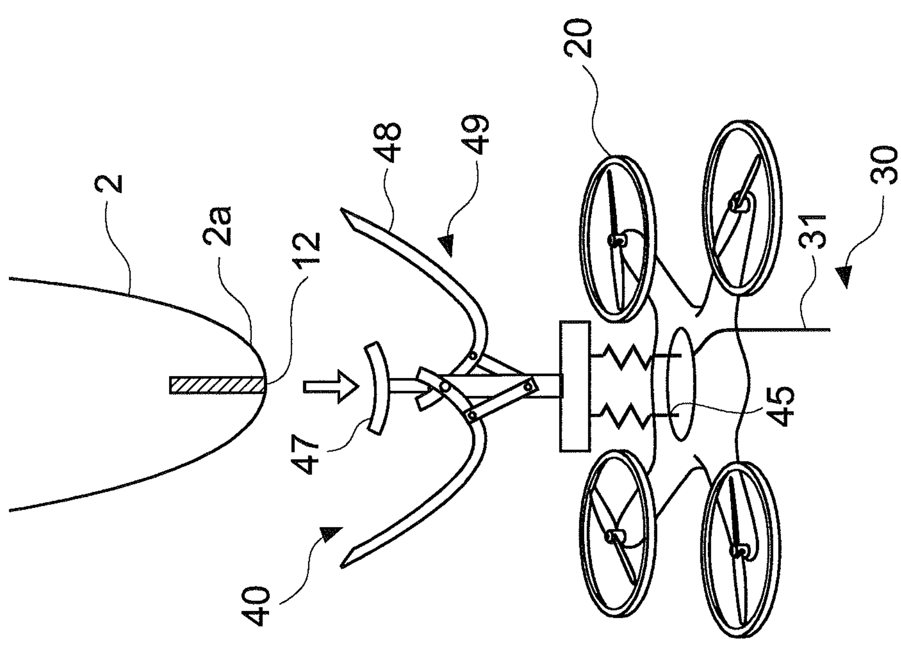
Figure 7B:
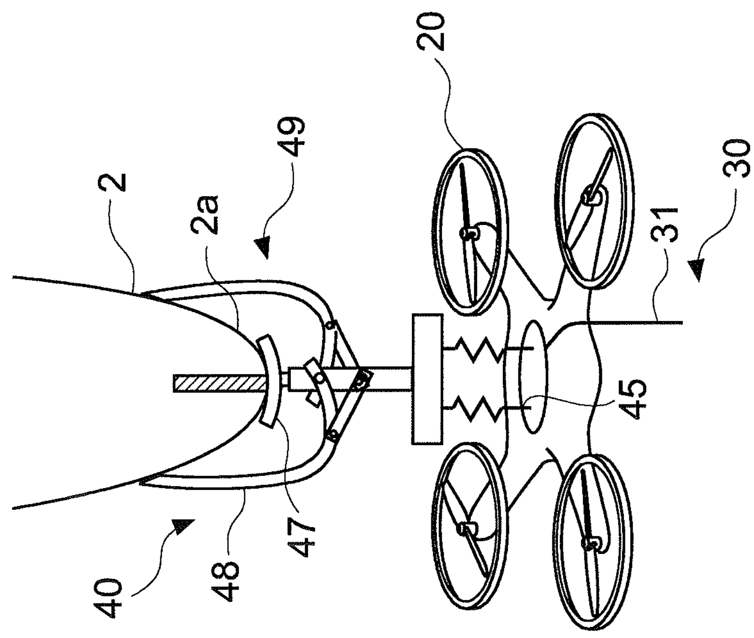
Figure 8:
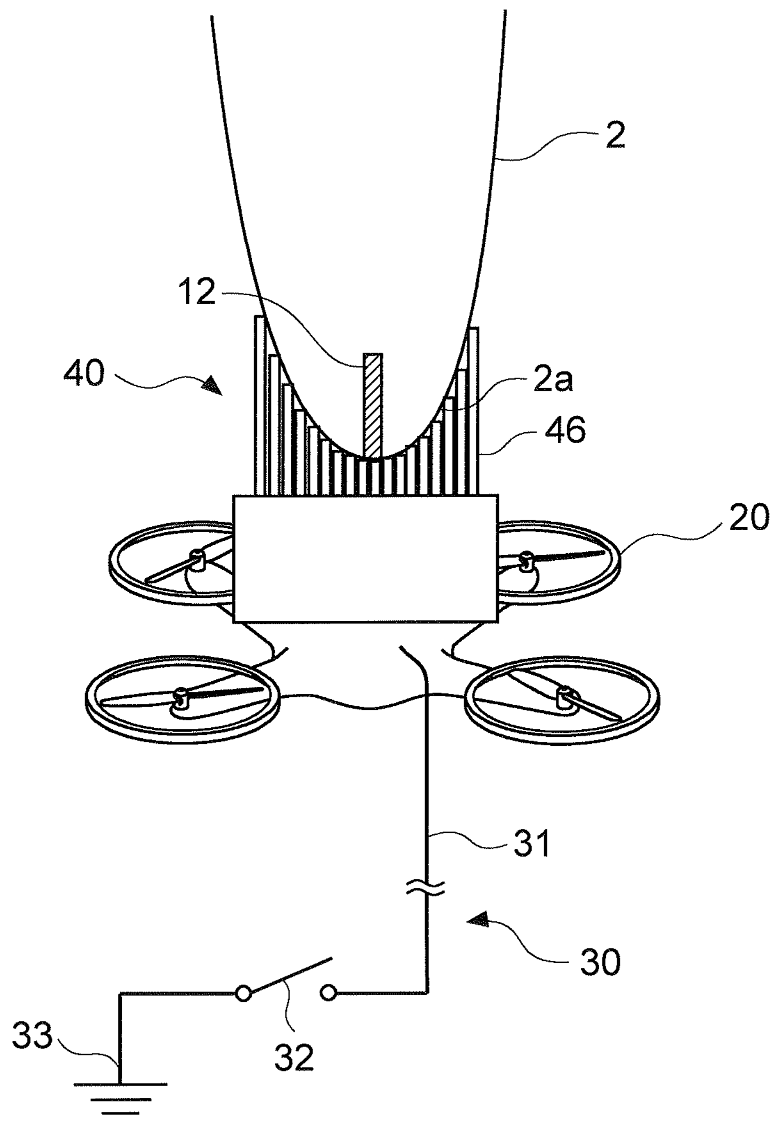

The position determining portion 40 may include at least one of: a cap 41 to be in engagement with the tip portion 2*a* of the wind turbine blade 2 (see FIG. 2); a clamp 48 configured to nip the tip portion 2*a* of the wind turbine blade 2 in response to operation of a link mechanism 49 upon being pressed against the tip portion 2*a* of the wind turbine blade 2 (see FIG. 7); or a shaping portion 46 which is deformable so as to follow the outer shape of the tip portion 2*a* upon being pressed against the tip portion 2*a* of the wind turbine blade 2 (see FIG. 8).

Making use of the position determining portion 40 including at least one of: the cap 41 to be in engagement with the tip portion 2*a* of the wind turbine blade 2 (see FIG. 2); the clamp 48 configured to nip the tip portion 2*a* of the wind turbine blade 2 (see FIG. 7); or the shaping portion 46 being deformable so as to follow the outer shape of the tip portion 2*a* (see FIG. 8), makes it possible to retain the relative position of the UAV 20 with respect to the receptor 12 reliably. Accordingly, it is possible to perform works for forming the electric continuity test circuit 30 including the receptor 12 efficiently by using the UAV 20.

Next, each embodiment will be described in detail.

Figure 2:
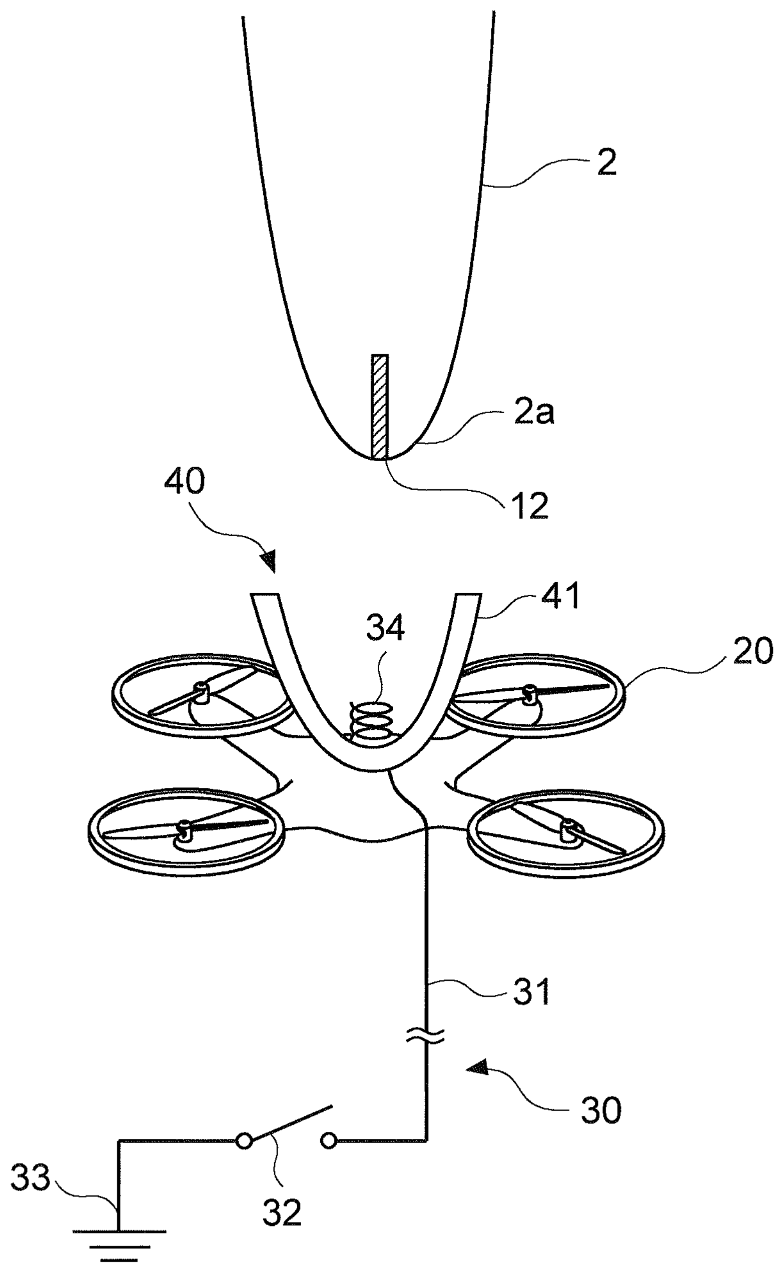
FIGS. 2 to 15 are each a schematic diagram showing a method of testing a receptor according to an embodiment.

In the embodiment depicted in FIG. 2, the UAV 20 is provided with a cap 41 to be in engagement with the tip portion 2*a* of the wind turbine blade 2, which serves as the position determining portion 40. Inside the cap 41, a conductive member, which is an electrical contact portion, is provided. Furthermore, a shock absorbing member may be disposed inside the cap 41. For instance, a metal spring 34 is disposed inside the cap 41, which has functions of both of the electrical contact portion and the shock absorbing member.

In the method of testing the receptor 12 with the above configuration, the UAV 20 is moved close to the wind turbine blade 2, and then the tip portion 2*a* of the wind turbine blade 2 is engaged with the inside of the cap 41 mounted to the UAV 20. This state is maintained to retain the relative position of the UAV 20 with respect to the receptor 12. At this time, the tip portion 2*a* of the wind turbine blade 2 is pressed against the spring 34 inside the cap 41. Accordingly, the electric continuity test circuit 30 including the receptor 12 is formed. Further, a voltage is applied to the electric continuity test circuit 30 and an electric continuity test is performed on the receptor 12.

Figure 3:
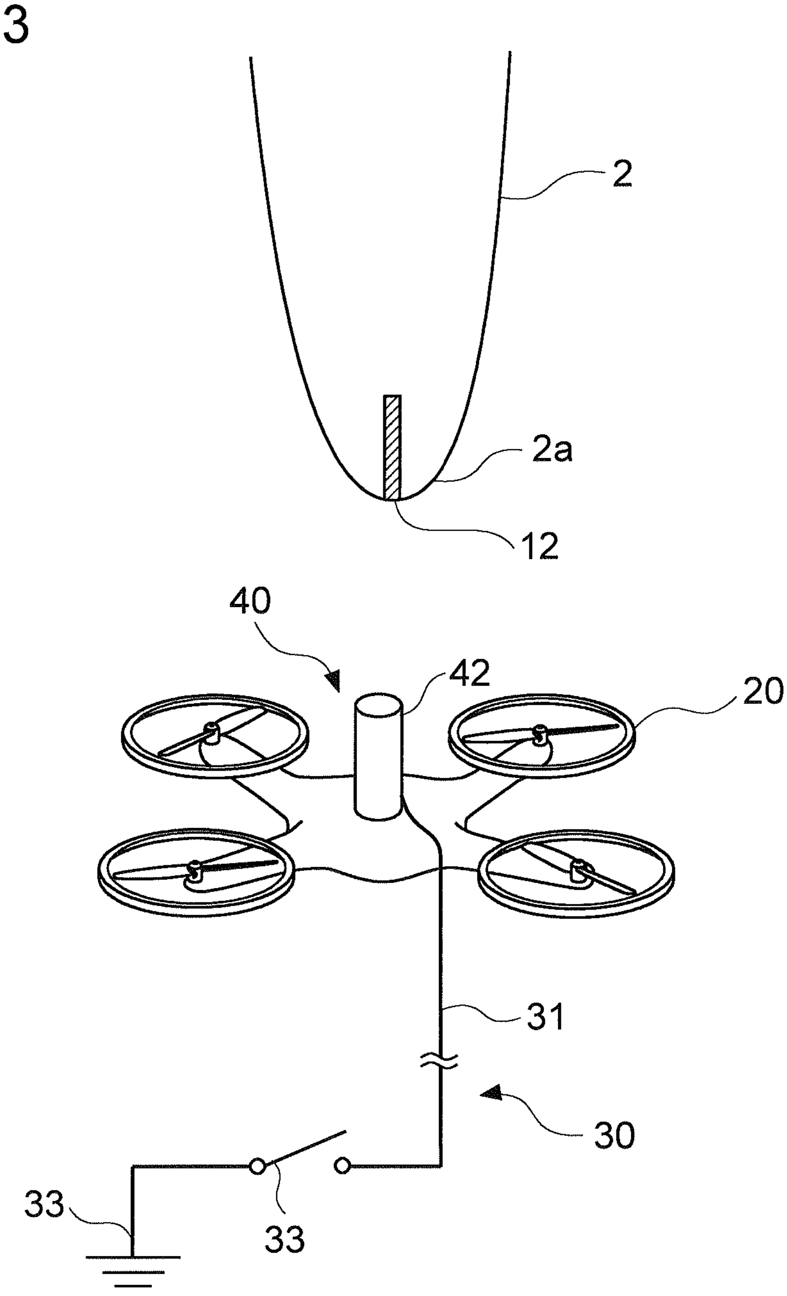

In the embodiment depicted in FIG. 3, at least a part of the receptor 12, or at least a part of a portion of the wind turbine blade 2 around the receptor 12 is formed from a magnetic element.

In a case where at least a part of the receptor 12 is formed from a magnetic element, the material of the receptor 12 may be a stainless steel-based material (e.g. SUS430, SUS 410), a copper-based material (e.g. copper, tin, plated copper, hot-tip galvanized copper), a carbon steel, etc. It should be noted that the receptor 12 is made from a material that can bear the composite effect of electrical, thermal, and electronic stresses generated by lightning current.

In a case where a portion around the receptor 12 is formed from a magnetic element, the magnetic element does not need to have conductivity. To prevent lightning current from flowing to portions other than the down-conductor 14 (see FIG. 1) upon receipt of lightning by the receptor 12, it is preferable if the magnetic element is not conductive.

The UAV 20 is provided with a magnetic-force generating part 42.

The magnetic-force generating part 42 may be capable of switching a magnetic force. For instance, the magnetic-force generating part 42 includes an electromagnet or a magnetic chuck, thus being capable of switching ON and OFF of the magnetic force. The magnetic force is turned ON to move the UAV 20 closer to the receptor 12, and is turned OFF to move the UAV 20 away from the magnetic-force generating part 42 after the test is completed.

In the method of testing the receptor 12 with the above configuration, the UAV 20 is moved close to the wind turbine blade 2, and the wire 31 is connected to the receptor 12 to form the electric continuity test circuit 30, while a magnetic force generated by the magnetic-force generating part 42 of the UAV 20 is applied to the magnetic element. An electric continuity test is then performed on the receptor 12 while the relative position of the UAV 20 is fixed with respect to the receptor 12.

Accordingly, at least a part of the receptor 12 or a portion of the wind turbine blade 2 around the receptor 12 is formed by a magnetic element, and the magnetic force generated by the magnetic-force generating part 42 is applied to the magnetic element, which makes it possible to maintain the UAV 20 fixed to the receptor 12 or to a peripheral portion thereof, and thus to improve the efficiency of works for connecting wire to the receptor 12 (works for forming an electric continuity test circuit) by using the UAV 20.

Furthermore, the magnetic-force generating part 42 may be configured to be rotatable with respect to the body of the UAV 20, about two axes orthogonal to the upward-and-downward direction of the UAV 20. In other words, the magnetic-force generating part 42 may be gimbal-supported (not depicted) with respect to the body of the UAV 20. With the magnetic-force generating part 42 being gimbal-supported, the magnetic-force generating part 42 is normally retained in a horizontal position automatically by gravity. When the magnetic-force generating part 42 approaches the receptor 12, the magnetic-force generating part 42 automatically starts to be parallel to the receptor 12 or to the magnetic element portion around the receptor 12, and thus it is possible to cause the magnetic-force generating part 42 to attract and make contact with the receptor 12 or with the magnetic element portion around the receptor 12.

Accordingly, the magnetic-force generating part 42 is configured to be rotatable with respect to the body of the UAV 20, and thus it is possible to attract the magnetic-force generating part 42 toward the magnetic element reliably regardless of the relative attitude of the UAV 20 with respect to the magnetic element (receptor 12 or a peripheral portion thereof), which makes it possible to further improve the efficiency of works for connecting wire to the receptor 12 by using the UAV 20.

Figure 4:
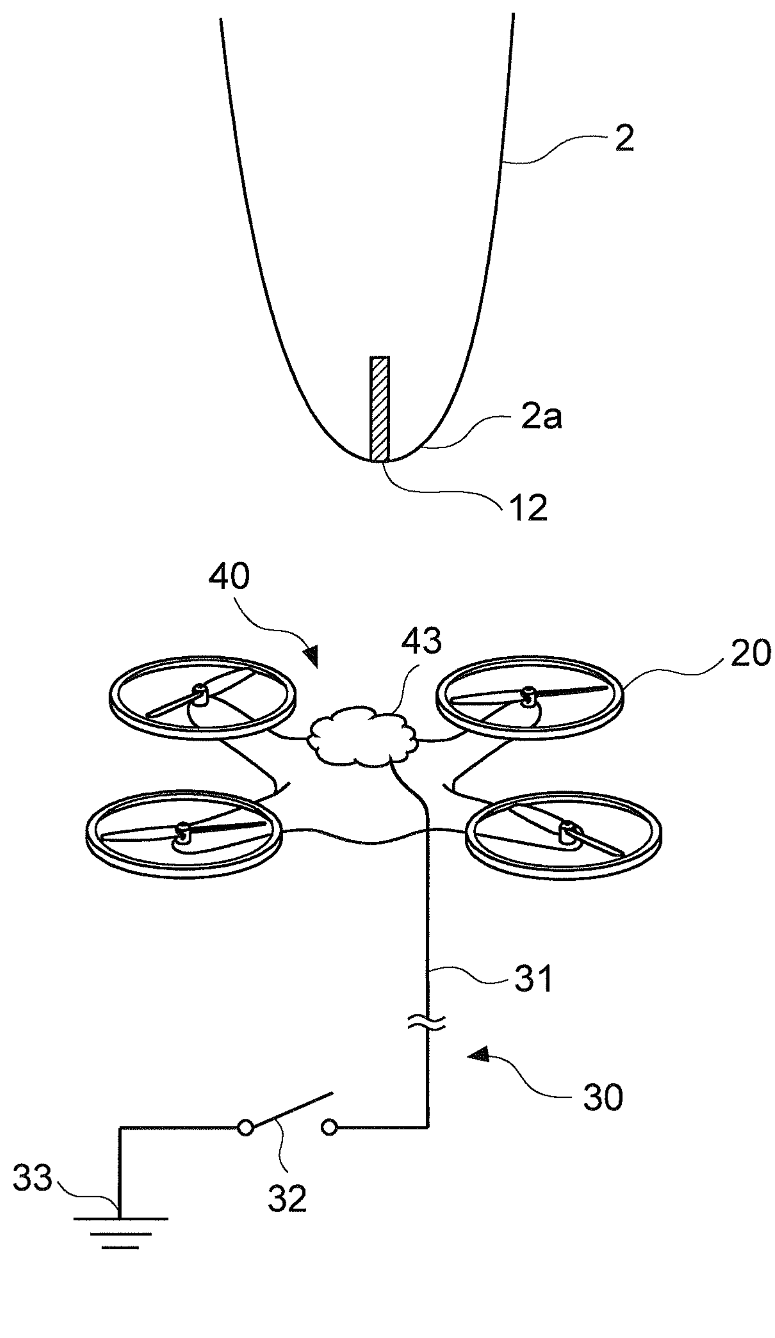
Figure 5:
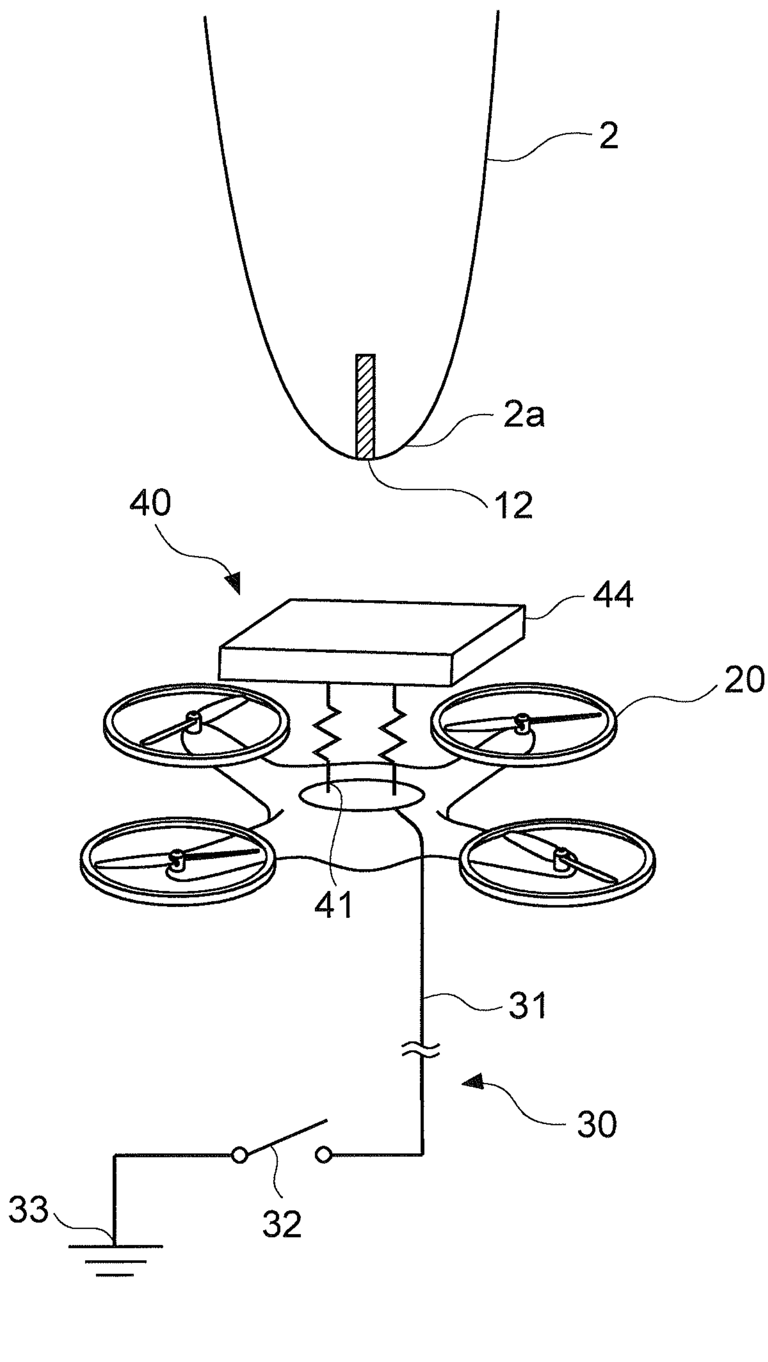
Figure 6:
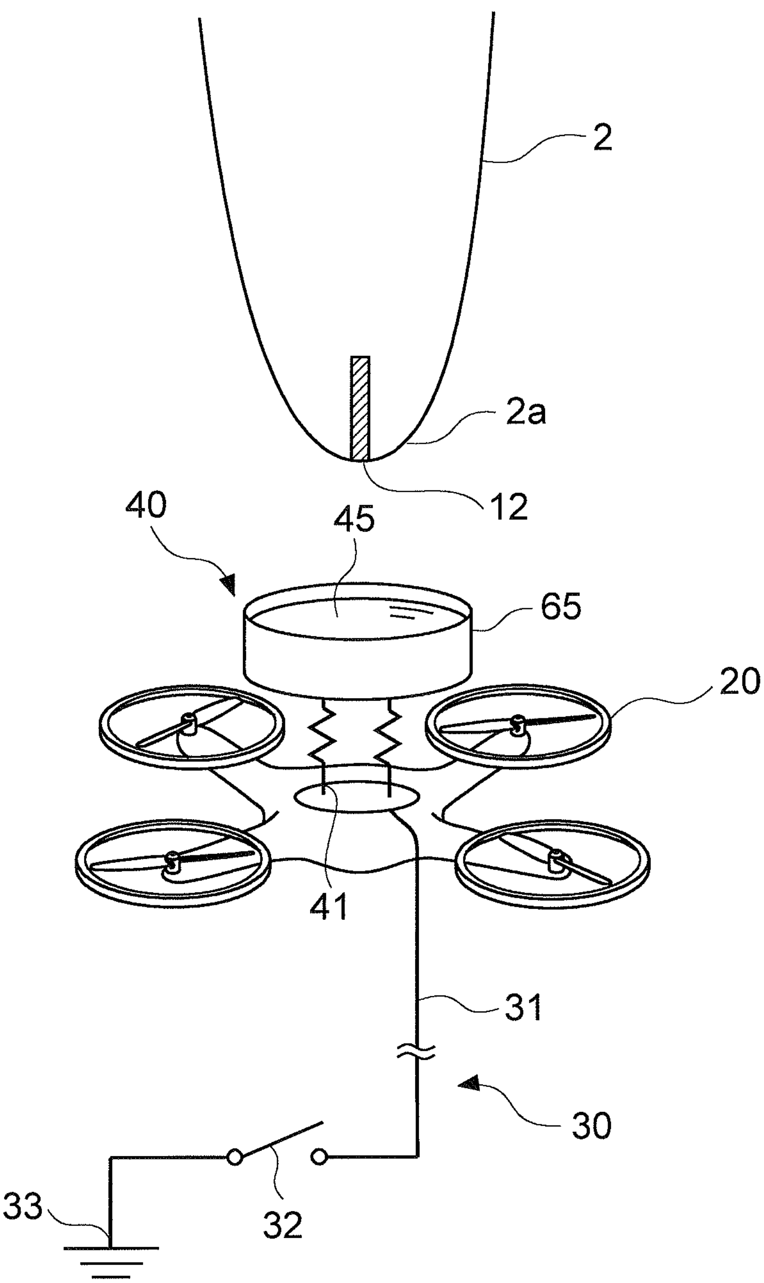

In embodiments depicted in FIGS. 4 to 6, the UAV 20 is provided with a shock absorbing member having a conductive portion at least on the surface side of the shock absorbing member. For instance, a shock absorbing member may be: a conductive adhesive tape 43, or a cushion member containing a conductive adhesive agent as depicted in FIG. 4; a conductive sheet 44, a conductive pate, a conductive clay, or a metal scrubber as depicted in FIG. 5; a conductive gel 45 as depicted in FIG. 6; or the spring 34 depicted in FIG. 2, for instance.

In the method of testing the receptor 12 with the above configuration, the UAV 20 is moved close to the wind turbine blade 2, and the receptor 12 is brought into contact with the shock absorbing member provided for the UAV 20. This state is maintained to retain the relative position of the UAV 20 with respect to the receptor 12. At this time, the receptor 12 of the wind turbine blade 2 is pressed against the shock absorbing member. Accordingly, the electric continuity test circuit 30 including the receptor 12 is formed. Further, a voltage is applied to the electric continuity test circuit 30 and an electric continuity test is performed on the receptor 12.

In the method of testing the receptor 12 with this configuration, in the step of forming the electric continuity test circuit 30, the UAV 20 is moved to press the shock absorbing member against the wind turbine blade 2, whereby the wire 31 is connected to the receptor 12 via a conductive portion of the shock absorbing member to form the electric continuity test circuit 30.

Accordingly, it is possible to connect wire to the receptor 12 efficiently via a conductive portion (electrical contact portion) of the shock absorbing member while mitigating shock due to contact between the UAV 20 and the wind turbine blade 2 with the shock absorbing member.

In this method, if a shock absorbing member also having an adhesive property is used, such as the conductive adhesive tape 43 depicted in FIG. 4, the receptor 12 is coupled to the shock absorbing member while the receptor 12 is in contact with the shock absorbing member disposed on the UAV 20. Accordingly, it is possible to retain the relative position of the UAV 20 with respect to the receptor 12 appropriately.

Furthermore, if the conductive sheet 44 depicted in FIG. 5 is used, there is an advantage that electrical continuity of the receptor 12 can be secured without determining the position strictly.

In the embodiment depicted in FIG. 6, the UAV 20 includes a container 65 storing a conductive element in a liquid from, a gel from, or a powder form. In the drawing, a conductive gel 45 is stored in the container 65.

In the method of testing the receptor 12, in the step of forming the electric continuity test circuit, the UAV 20 is moved to put a portion of the wind turbine blade 2 including the receptor 12 into the container 65, whereby the wire 31 is connected to the receptor 12 via the conductive element 61 and the electric continuity test circuit 30 is formed.

Accordingly, it is possible to connect wire to the receptor 12 via the conductive element 61 efficiently, by operating the UAV 20 so that a tip of the wind turbine blade 2 enters the container 60 storing the conductive element 61. Furthermore, if the conductive gel 45 stored in the container 65 is used as depicted in FIG. 6, it is possible to establish secure electric continuity with the receptor 12 by immersing the receptor 12 on the tip of the wind turbine blade 2 into the conductive gel 45, without adjusting the position strictly. The conductive gel 25 has another advantageous that it is less likely to spill out of the container 65 even if the UAV 20 sways.

In the embodiment depicted in FIG. 7, the UAV 20 is provided with the clamp 48 configured to nip the tip portion 2*a* of the wind turbine blade 2 in response to operation of the link mechanism 49 upon being pressed against the tip portion 2*a* of the wind turbine blade 2, the clamp 48 serving as the position determining portion 40. For instance, when the wind turbine blade 2 is pressed against a contact portion 47 coupled to the clamp 48 (see FIG. 7A), the contact portion 47 is pushed down so that the link mechanism 49 operates, and thereby the clamp 48 nips the wind turbine blade 2 (see FIG. 7B). Accordingly, it is possible to retain the relative position of the UAV 20 with respect to the receptor 12. At this time, if the contact portion 47 is formed from a conductive element, for instance, the electric continuity test circuit 30 including the receptor 12 is formed. Further, a voltage is applied to the electric continuity test circuit 30 and an electric continuity test is performed on the receptor 12.

According to this method, it is possible to determine the position appropriately, but the accuracy required is not so high, and thus operation of the UAV 20 is simplified.

In the embodiment depicted in FIG. 8, the UAV 20 is provided with the shaping portion 46 configured to be deformable so as to follow the outer shape of the tip portion 2*a* by being pressed against the tip portion 2*a* of the wind turbine blade 2, the shaping portion 46 serving as the position determining portion 40. For instance, the shaping portion 46 has a plurality of rod members which can extend and contract, thus being configured to deform along the outer shape of the wind turbine blade 2. The shaping portion 46 may have a two-dimensional shape.

According to this method, it is possible to determine the position appropriately, but the accuracy required is not so high, and thus operation of the UAV 20 is simplified.

In the embodiment depicted in FIG. 9, the UAV 20 includes a reel 54 with a wire 31 wound around the reel 54.

In the method of testing the receptor 12, in the step of forming the electric continuity test circuit 30, the UAV 20 is moved close to the wind turbine blade 2 to connect the wire 31 to the receptor 12 (see FIG. 9A), and then the wire 31 is unreeled from the reel 54 (see FIG. 9B).

In this configuration, in the step of forming the electric continuity test circuit 30, after the UAV 20 attaches the wire 31 of the reel 54 to the receptor 12, the UAV 20 may be detached from the reel 54 so that the reel 54 moves downward while unreeling.

Accordingly, it is possible to move the UAV 20 close to the wind turbine blade 2 while the wire 31 is wound around the reel 54, and thus it is possible to prevent a decrease in the attitude stability of the UAV 20 due to a drag that the wire 31 receives if the wire 31 is suspended from the UAV 20 while the UAV moves upward.

Furthermore, the reel 54 is detached from the UAV 20 to unreel and move down after an end of the wire 31 is attached to the receptor 12, and thereby it is possible to form the electric continuity test circuit 30 readily by a worker below the wind turbine blade 2 recovering the other end of the wire 31 and connecting the wire 31 to an earth terminal, for instance.

Furthermore, in the embodiment depicted in FIG. 9, at least a part of the receptor 12, or at least a part of a portion of the wind turbine blade 2 around the receptor 12 is formed from a magnetic element, and at least a part of the receptor 12 is formed from a magnetic element. A magnetic force generated by the magnetic-force generating part 55 attracts the receptor 12 so that the magnetic-force generating part 55 makes contact with the receptor 12.

Furthermore, as depicted in FIG. 10, the UAV 20 may suspend the wire 31 from above to cause the magnetic-force generating part 55 to attract and make contact with the receptor 12, while the wind turbine blade 2 is retained in the horizontal direction.

Furthermore, in the method of testing the receptor 12, in the step of forming the electric continuity test circuit 30, the receptor 12 may be connected to an earth wire via the wire 31 suspended from the UAV 20, and the wire 31 may be detached from the UAV 20 after performing an electric continuity test on the receptor 12.

Accordingly, it is possible to form the electric continuity test circuit 30 readily by connecting the receptor 12 to the earth wire via the wire 31 suspended from the UAV 20. Furthermore, by detaching the wire from the UAV 20 after completion of an electric continuity test, it is possible to improve the attitude stability of the UAV 20 during downward movement of the UAV 20 upon recovery of the UAV 20.

Figure 11:
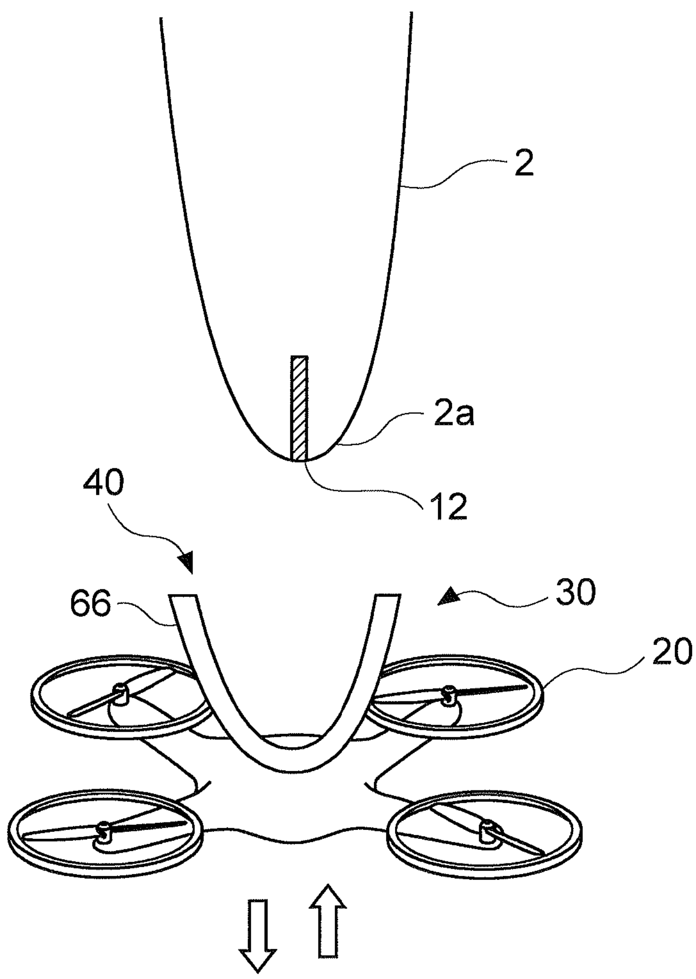

In the embodiment depicted in FIG. 11, in the step of performing an electric continuity test, a magnetic field applied to the receptor 12 is changed by using the UAV 20 to detect an induction current generated in a circuit from the receptor 12 to the earth wire. For instance, a magnetic field in the vicinity of the receptor 12 may be changed by controlling the UAV 20 provided with the magnetic generating part 66 so as to change the distance between the UAV 20 and the receptor 12.

According to the above method, changing a magnetic field applied to the receptor 12 makes it possible to generate an induction current in a circuit (e.g. the down-conductor 14 depicted in FIG. 1) from the receptor 12 to the earth wire. Thus, it is possible to confirm electrical connection between the receptor 12 and the earth wire by simply detecting an induction current generated in a circuit from the receptor 12 to the earth wire.

Figure 12:
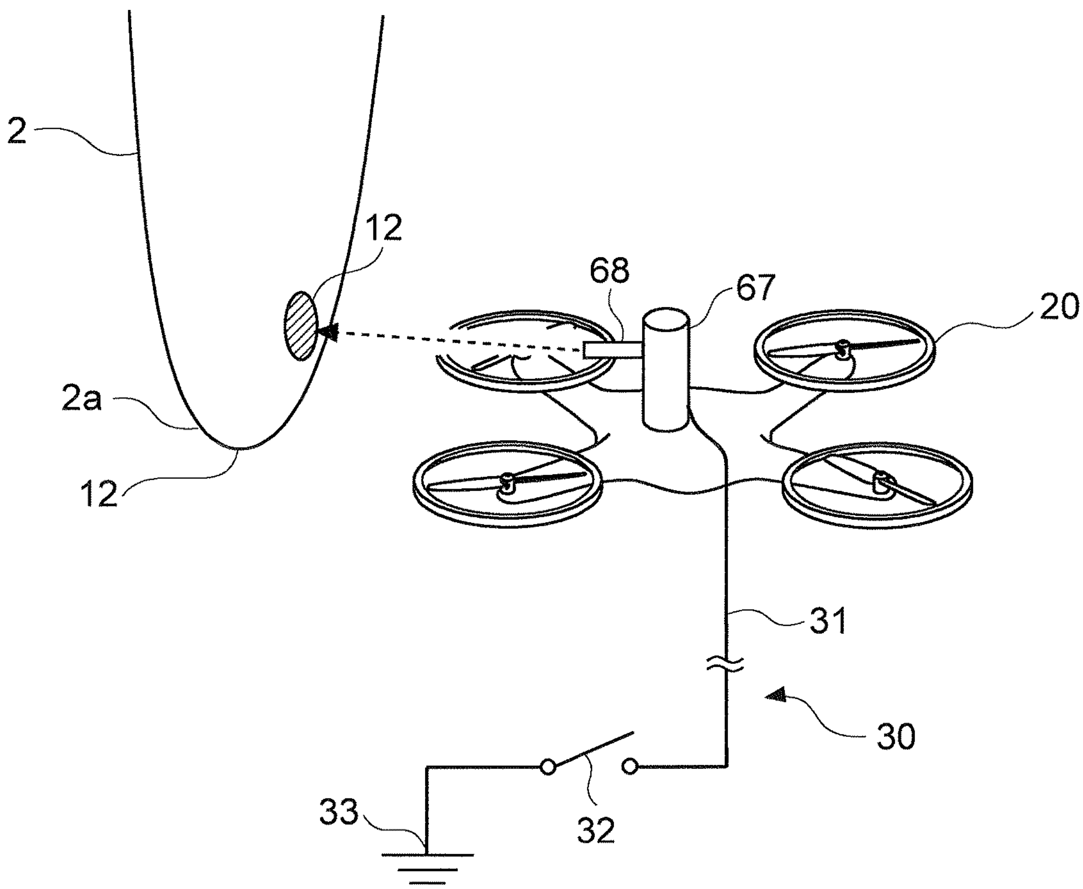

In the embodiment depicted in FIG. 12, the UAV 20 includes a tank 67 storing a conductive liquid, and a nozzle 68 for injecting water continuously to the receptor 12 from the tank 67.

With this configuration, the method of testing the receptor 12 further includes a step of injecting a conductive liquid from the UAV 20 to the receptor 12.

Furthermore, in the step of forming the electric continuity test circuit 30, the receptor 12 is connected to the wire 31 via a liquid flow of the conductive liquid.

Accordingly, it is possible to form the electric continuity test circuit 30 readily by electrically connecting the receptor 12 to the wire via a liquid flow of the conductive liquid.

Figure 13:
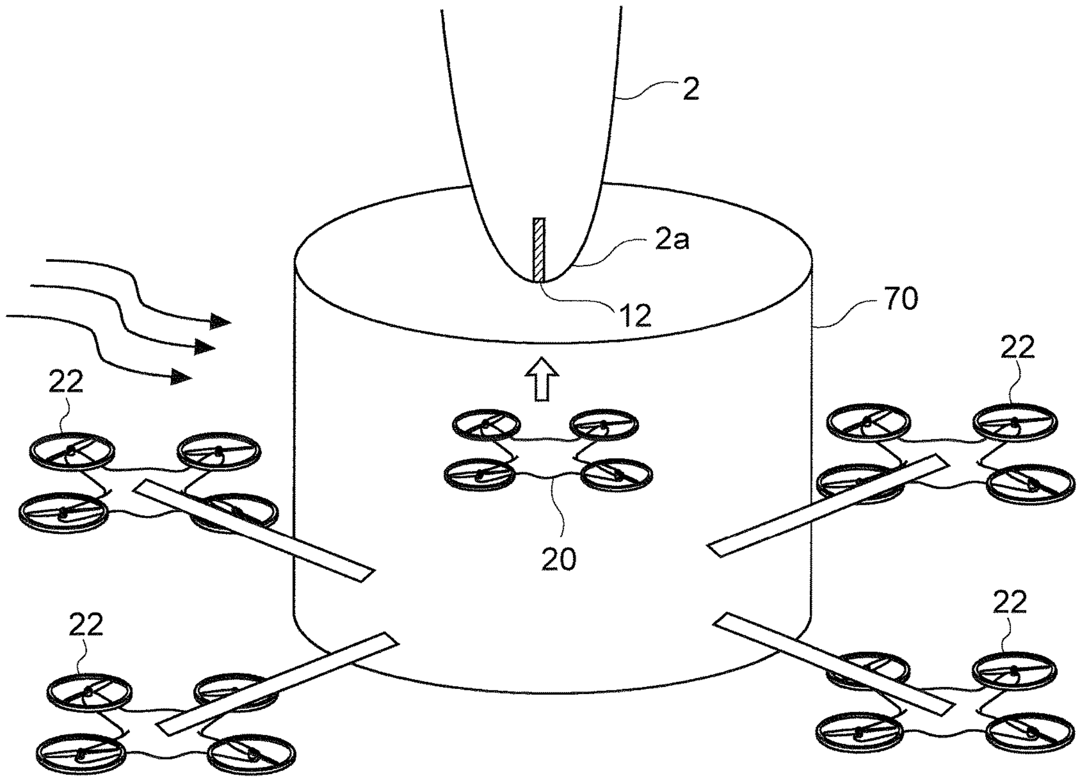

In the embodiment depicted in FIG. 13, the method of testing the receptor 12 further includes a step of surrounding the UAV 20 with a windshield member 70 mounted to at least one auxiliary UAV 22. The configuration of the UAV 20 for performing an electric continuity test may be employed from any one of the embodiments depicted in FIGS. 2 to 12, and is not described here again in detail.

Accordingly, the UAV 20 is covered with the windshield member 70 mounted to the at least one auxiliary UAV 22, and thus it is possible to maintain the attitude stability of the UAV 20 without being affected by wind, while the UAV 20 approaches the receptor 12, or while the UAV 20 is in a standby state near the receptor 12.

Figure 14A:
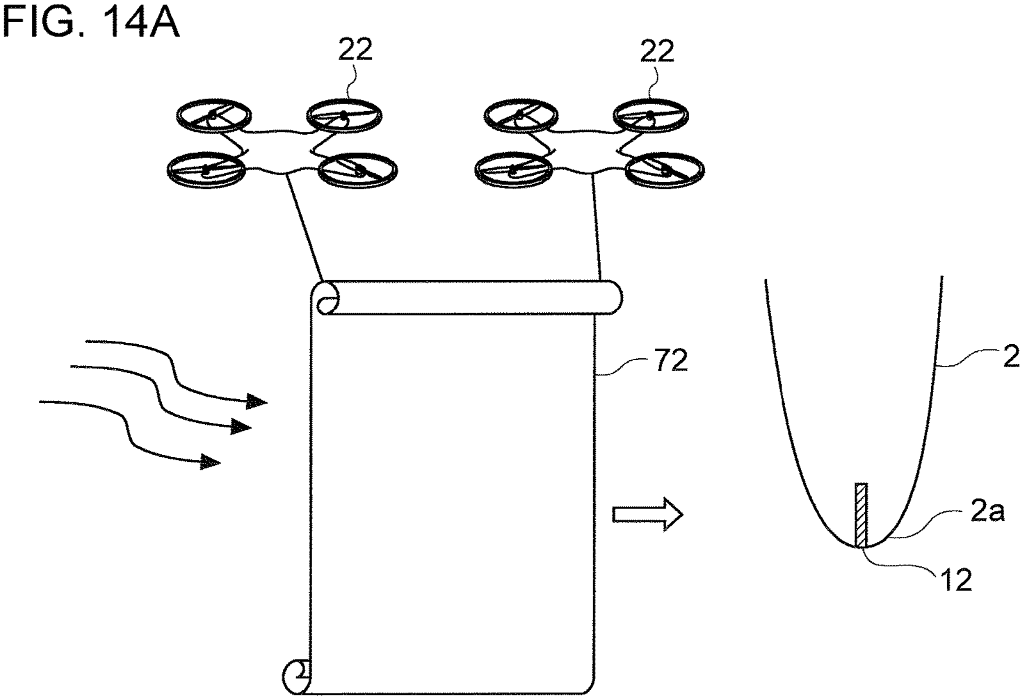
Figure 14B:
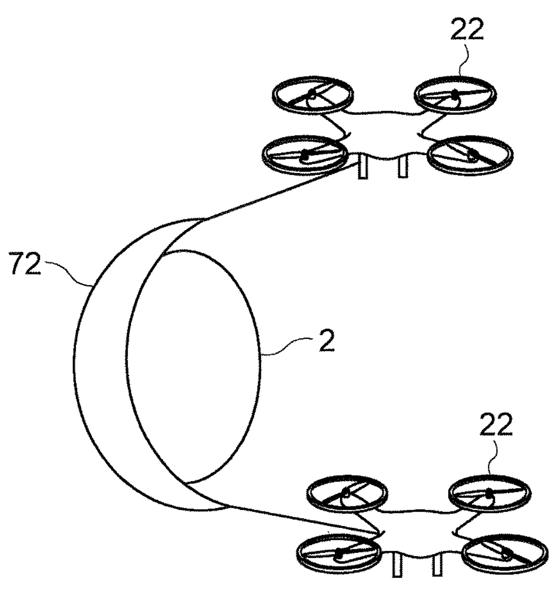

In the embodiment depicted in FIG. 14, in the step of forming the electric continuity test circuit 30, while a conductive cloth member 72 constituting a part of the electric continuity test circuit 30 is suspended from the at least one UAV 22, the UAV 22 is moved close to the wind turbine blade 2 from the upwind side (see FIG. 14A), and the conductive cloth member 72 is pressed against a portion of the wind turbine blade 2 including the receptor 12 by utilizing wind (see FIG. 14B).

Accordingly, it is possible to form the electric continuity test circuit 30 readily by hanging the conductive cloth member 72 from the UAV 22, moving the UAV 22 toward the wind turbine blade 2 from the upwind side, and pressing the conductive cloth member 72 against the receptor 12 by making use of wind. FIG. 14B is a top view of FIG. 14A.

Figure 15:
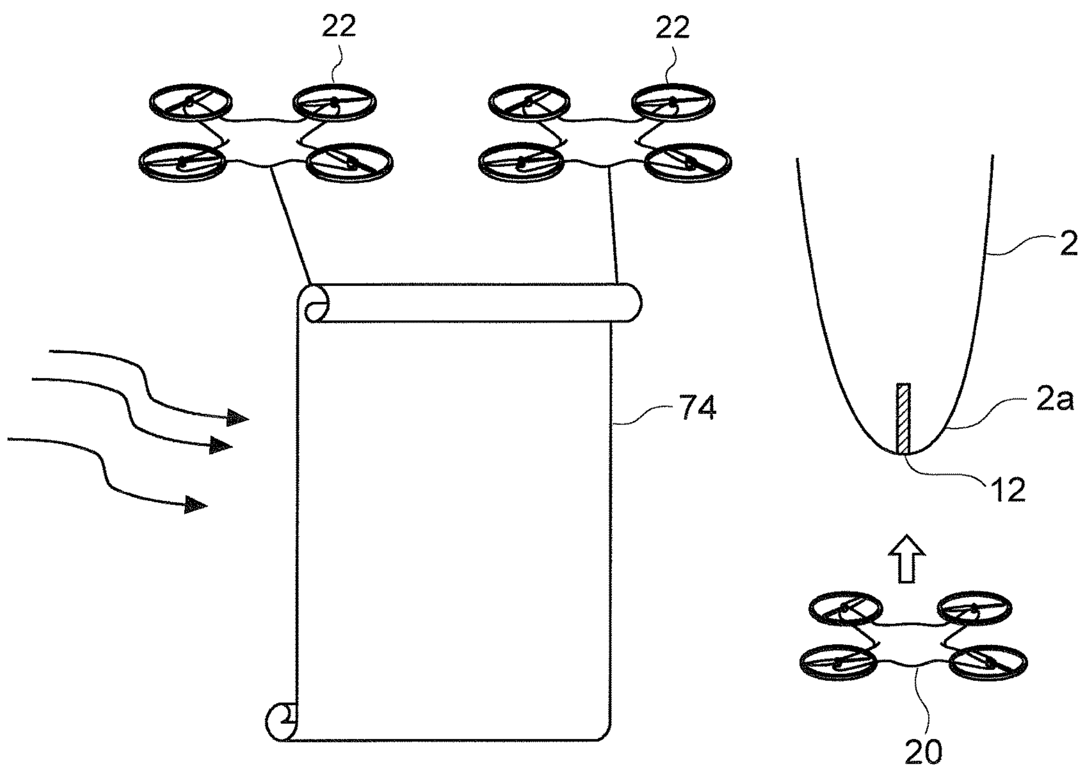

In the embodiment depicted in FIG. 15, in the step of forming the electric continuity test circuit 30, a windshield cloth 74 may be suspended from the at least one UAV 22, and the UAV 20 may be moved close to the wind turbine blade 2 from the upwind side.

As described above, according to some embodiments of the present invention, using the UAV 20 to test the receptor 12 of the wind turbine makes it easier to approach the receptor 12 of the wind turbine blade 2 mounted to the hub 3, and to perform an electric continuity test on the receptor 12 readily. Thus, it is possible to shorten the testing time, as well as to reduce the testing costs, as compared to an electric continuity test using a vehicle for work at height.

Embodiments of the present invention were described in detail above, but the present invention is not limited thereto, and various amendments and modifications may be implemented.

For instance, an expression of relative or absolute arrangement such as "in a direction", "along a direction", "parallel", "orthogonal", "centered", "concentric" and "coaxial" shall not be construed as indicating only the arrangement in a strict literal sense, but also includes a state where the arrangement is relatively displaced by a tolerance, or by an angle or a distance whereby it is possible to achieve the same function.

For instance, an expression of an equal state such as "same" "equal" and "uniform" shall not be construed as indicating only the state in which the feature is strictly equal, but also includes a state in which there is a tolerance or a difference that can still achieve the same function.

Further, for instance, an expression of a shape such as a rectangular shape or a cylindrical shape shall not be construed as only the geometrically strict shape, but also includes a shape with unevenness or chamfered corners within the range in which the same effect can be achieved.

On the other hand, an expression such as "comprise", "include", "have", "contain" and "constitute" are not intended to be exclusive of other components.

The invention claimed is:

1. A method of testing a receptor of a wind turbine, the method comprising:

a step of moving an unmanned aerial vehicle (UAV) close to the receptor of a wind turbine blade mounted to a hub of the wind turbine, and performing an electric continuity test on the receptor; and a step of forming an electric continuity test circuit including the receptor by using the UAV, wherein the step of performing the electric continuity test includes applying a voltage to the electric continuity test circuit, wherein the UAV includes a reel provided with a wire wound around the reel, and wherein the step of forming the electric continuity test circuit includes moving the UAV close to the wind turbine blade to connect the wire to the receptor, and unwinding the wire from the reel to form the electric continuity test a part of which is formed by the unwound wire.

2. The method of testing a receptor of a wind turbine according to claim 1, wherein the receptor is disposed on a tip portion of the wind turbine blade, and wherein the method further comprises a step of engaging the tip portion of the wind turbine blade with a position-determining portion disposed on the UAV to retain a relative position of the UAV with respect to the receptor.

3. The method of testing a receptor of a wind turbine according to claim 1, wherein at least a part of the receptor, or at least a part of a portion of the wind turbine blade around the receptor is formed by a magnetic element, and wherein the step of forming the electric continuity test circuit includes connecting the wire to the receptor while applying a magnetic force generated by a magnetic-force generating part disposed on the UAV to the magnetic element.

4. The method of testing a receptor of a wind turbine according to claim 3, wherein the magnetic-force generating part is configured to be rotatable relative to a body of the UAV, about two axes orthogonal to an upward-and-downward direction of the UAV.

5. The method of testing a receptor of a wind turbine according to claim 1, wherein the UAV includes a container storing a conductive element in a liquid form, a gel form or a powder form, and wherein the step of forming the electric continuity test circuit includes forming the electric continuity test circuit by moving the UAV to cause a portion of the wind turbine blade including the receptor to enter the container and connect a wire to the receptor via the conductive element.

6. The method of testing a receptor of a wind turbine according to claim 1, wherein the step of forming the electric continuity test circuit includes attaching the wire of the reel to the receptor by using the UAV, detaching the UAV from the reel, and allowing the reel to unreel and move downward.

7. The method of testing a receptor of a wind turbine according to claim 1, wherein the step of forming the electric continuity test circuit includes connecting the receptor to an earth wire via a wire suspended from the UAV, and wherein the method further comprises a step of detaching the wire from the UAV, after performing the electric continuity test on the receptor.

8. The method of testing a receptor of a wind turbine according to claim 1, further comprising a step of injecting a conductive liquid to the receptor from the UAV, wherein the step of forming the electric continuity test circuit includes connecting the receptor to the wire via a liquid flow of the conductive liquid.

9. The method of testing a receptor of a wind turbine according to claim 1, further comprising a step of surrounding the UAV with a wind shield member mounted to at least one auxiliary UAV.

10. The method of testing a receptor of a wind turbine according to claim 1, wherein the step of performing the electric continuity test includes changing a magnetic field applied to the receptor by using the UAV and detecting an induction current generated in a circuit from the receptor to an earth wire.

11. A method of testing a receptor of a wind turbine, comprising:

a step of moving an unmanned aerial vehicle (UAV) close to the receptor of a wind turbine blade mounted to a hub of the wind turbine, and performing an electric continuity test on the receptor; and a step of forming an electric continuity test circuit including the receptor by using the UAV, wherein the step of performing the electric continuity test includes applying a voltage to the electric continuity test circuit, wherein the receptor is disposed on a tip portion of the wind turbine blade, wherein the method further comprises a step of engaging the tip portion of the wind turbine blade with a position-determining portion disposed on the UAV to retain a relative position of the UAV with respect to the receptor, and wherein the position-determining portion includes at least one of: a cap engageable with the tip portion of the wind turbine blade; a clamp configured to nip the tip portion of the wind turbine blade in response to operation of a link mechanism by being pressed against the tip portion of the wind turbine blade; or a shaping portion which is deformable so as to follow an outer shape of the tip portion by being pressed against the tip portion of the wind turbine blade.

12. A method of testing a receptor of a wind turbine, comprising:

a step of moving an unmanned aerial vehicle (UAV) close to the receptor of a wind turbine blade mounted to a hub of the wind turbine, and performing an electric continuity test on the receptor; and a step of forming an electric continuity test circuit including the receptor by using the UAV, wherein the step of performing the electric continuity test includes applying a voltage to the electric continuity test circuit, wherein the UAV includes a shock absorbing member including a conductive portion at least on a surface side of the shock absorbing member, and wherein the step of forming the electric continuity test circuit includes forming the electric continuity test circuit by moving the UAV to press the shock absorbing member against the wind turbine blade and connect a wire to the receptor via the conductive portion of the shock absorbing member.

13. A method of testing a receptor of a wind turbine, comprising:

a step of moving an unmanned aerial vehicle (UAV) close to the receptor of a wind turbine blade mounted to a hub of the wind turbine, and performing an electric continuity test on the receptor; and a step of forming an electric continuity test circuit including the receptor by using the UAV, wherein the step of performing the electric continuity test includes applying a voltage to the electric continuity test circuit, and wherein the step of forming the electric continuity test circuit includes suspending a conductive cloth member which constitutes a part of the electric continuity test circuit from at least one of the UAV, moving the at least one UAV toward the wind turbine blade from an upwind side, and pressing the conductive cloth member against a portion of the wind turbine blade including the receptor by making use of wind.

* * * * *